United States Patent
Chen et al.

(10) Patent No.: US 10,672,623 B2
(45) Date of Patent: Jun. 2, 2020

(54) TRANSISTOR AND METHOD OF MANUFACTURING THE SAME

(71) Applicant: E Ink Holdings Inc., Hsinchu (TW)

(72) Inventors: Wei-Tsung Chen, Hsinchu (TW); Po-Hsin Lin, Hsinchu (TW); Xue-Hung Tsai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 60 days.

(21) Appl. No.: 16/212,603

(22) Filed: Dec. 6, 2018

(65) Prior Publication Data

US 2019/0115227 A1    Apr. 18, 2019

Related U.S. Application Data

(62) Division of application No. 15/593,348, filed on May 12, 2017, now Pat. No. 10,186,430.

(30) Foreign Application Priority Data

Aug. 9, 2016  (CN) .......................... 2016 1 0643509

(51) Int. Cl.
  *H01L 21/385*  (2006.01)
  *H01L 21/4757*  (2006.01)
  (Continued)

(52) U.S. Cl.
  CPC ........ *H01L 21/385* (2013.01); *H01L 21/4757* (2013.01); *H01L 29/66969* (2013.01); *H01L 29/7869* (2013.01); *H01L 29/78618* (2013.01)

(58) Field of Classification Search
  CPC ............... H01L 21/385; H01L 21/4757; H01L 29/66969; H01L 29/78618; H01L 29/7869
  See application file for complete search history.

(56) References Cited

U.S. PATENT DOCUMENTS 8,530,273 B2   9/2013 den Boer
2008/0303020 A1  12/2008 Shin et al.
(Continued)

FOREIGN PATENT DOCUMENTS

TW    201140806 A    11/2011

OTHER PUBLICATIONS

Corresponding Taiwanese office action dated Jan. 5, 2017.

*Primary Examiner* — Matthew C Landau
*Assistant Examiner* — Dmitriy Yemelyanov
(74) *Attorney, Agent, or Firm* — CKC & Partners Co., LLC

(57) ABSTRACT

A method of manufacturing a transistor, includes: (i) forming a metal-oxide semiconductor layer over a substrate; (ii) forming a source electrode and a drain electrode on different sides of the metal-oxide semiconductor layer; (iii) forming a dielectric layer over the source electrode, the drain electrode, and the metal-oxide semiconductor layer; (iv) forming a hydrogen-containing insulating layer over the dielectric layer, in which the hydrogen-containing insulating layer has an aperture exposing a surface of the dielectric layer, and the aperture is overlapped with the metal-oxide semiconductor layer when viewed in a direction perpendicular to the surface; (v) increasing a hydrogen concentration of a portion of the metal-oxide semiconductor layer by treating the hydrogen-containing insulating layer so to form a source region and a drain region; and (vi) forming a gate electrode in the aperture.

5 Claims, 7 Drawing Sheets

(51) Int. Cl.
*H01L 29/66* (2006.01)
*H01L 29/786* (2006.01)

(56) References Cited

U.S. PATENT DOCUMENTS

| | | | |
|---|---|---|---|
| 2012/0161125 A1* | 6/2012 | Yamazaki | H01L 27/1225 257/43 |
| 2012/0223307 A1* | 9/2012 | Sakata | H01L 21/02565 257/43 |
| 2014/0138677 A1* | 5/2014 | Chen | H01L 29/66969 257/43 |
| 2014/0374908 A1 | 12/2014 | Koezuka et al. | |

* cited by examiner

TRANSISTOR AND METHOD OF MANUFACTURING THE SAME

RELATED APPLICATIONS

This application is a Divisional Application of the U.S. application Ser. No. 15/593,348, filed May 12, 2017, which claims priority to China Application Serial Number 201610643509.7, filed Aug. 9, 2016, which is herein incorporated by reference.

BACKGROUND

Field of Invention

The present invention relates to a transistor and a method of manufacturing the same.

Description of Related Art

Metal oxide semiconductor transistors are thin-film transistors that utilize metal oxides as semiconductor layers. As compared with the amorphous silicon thin-film transistors, metal oxide semiconductor transistors have a higher carrier mobility and thus have a better electrical performance. In addition, since the manufacturing method of the metal oxide semiconductor transistors is simpler than the manufacturing method of low temperature polysilicon thin-film transistors, the productive efficiency of metal oxide semiconductor transistors is higher. In recent years, the industry has developed "self-aligned" processes for metal oxide semiconductor transistors to further reduce the length of the channel region so as to improve the electrical performance of the metal oxide semiconductor transistors.

FIG. 1 to FIG. 4 schematically depict cross-sectional diagrams illustrating a method of manufacturing a self-aligned transistor at various stages, according to the prior art. In FIG. 1, a metal-oxide semiconductor layer 20 is first formed over a substrate 21. Then, a source electrode 30 and a drain electrode 32 are formed on opposite sides of the metal-oxide semiconductor layer 20. After that, a dielectric layer 40 is formed to cover the metal-oxide semiconductor layer 20, the source electrode 30, and the drain electrode 32. After the dielectric layer 40 is formed, a gate electrode 50 is formed over the dielectric layer 40.

Subsequently, with reference to FIG. 2, the gate electrode 50 is used as a mask to perform an etching process so as to remove the portion of the dielectric layer 40 that is not covered by the gate electrode 50. A gate dielectric layer 52 is therefore formed underneath the gate electrode 50. The etching process allows the source electrode 30, the drain electrode 32, and portions of the metal-oxide semiconductor layer 20 to be exposed.

Thereafter, with reference to FIG. 3, a doping process is carried out onto the exposed portions of the metal-oxide semiconductor layer 20, using the gate electrode 50, the source electrode 30, and the drain electrode 32 as masks, so as to form a source region 20S and a drain region 20D in the metal-oxide semiconductor layer 20. The undoped portion of the metal-oxide semiconductor layer 20 under the gate electrode 50 form a channel region 20C. The length B of the channel region 20C is substantially determined by the width of the gate electrode 50.

However, the conventional method tends to have the problem that the process margin of the etching process is too narrow. FIG. 4 schematically depicts a cross-sectional view of some implementations after the etching process. As shown in FIG. 4, an over-etch phenomenon occurs in some area of the substrate, and that causes problems such as possible collapse of the gate electrode 50 and the difficulty in controlling the length of the channel region 20C. With the development of large-size manufacturing technology in display and semiconductor techniques, the problem of narrow process margin in the etching process becomes increasingly serious. In view of the above, there is a need for an improved metal oxide semiconductor transistor and a manufacturing method thereof.

SUMMARY

According to one aspect of the present disclosure, a method of manufacturing a transistor is provided. The manufactured transistor disclosed herein has a relatively shorter channel length, and may resolve the technical problem of narrow process margin of the etching process associated with the "self-aligned" process technology. Further, the method provides a relatively higher manufacturing yield. The method comprises the step of: (i). forming a metal-oxide semiconductor layer over a substrate; (ii). forming a source electrode and a drain electrode over two different sides of the metal-oxide semiconductor layer; (iii). forming a dielectric layer over the source electrode, the drain electrode, and the metal-oxide semiconductor layer; (iv). forming a hydrogen-containing insulating layer over the dielectric layer, in which the hydrogen-containing insulating layer has an aperture exposing a surface of the dielectric layer, and the aperture is overlapped with the metal-oxide semiconductor layer when viewed in a direction perpendicular to the surface; (v). increasing a hydrogen concentration of a portion of the metal-oxide semiconductor layer by treating the hydrogen-containing insulating layer so as to form a source region and a drain region in the metal-oxide semiconductor layer; and (vi). forming a gate electrode in the aperture.

In some embodiments, treating the hydrogen-containing insulating layer comprises performing a heat treatment to the hydrogen-containing insulating layer or irradiating the hydrogen-containing insulating layer with a laser beam.

In some embodiments, the source region has a first hydrogen concentration, the drain region has a second hydrogen concentration, and each of the first hydrogen concentration and the second hydrogen concentration is ranged from about $10^{16}$ atoms/cm$^2$ to about $10^{22}$ atoms/cm$^2$.

In some embodiments, a region between the source region and the drain region of the metal-oxide semiconductor layer defines a channel region of the metal-oxide semiconductor layer, and the channel region has a third hydrogen concentration of about 0 to about $10^{16}$ atoms/cm$^2$.

In some embodiments, a width of the aperture is smaller than a length of the metal-oxide semiconductor layer.

According to another aspect of the present disclosure, a transistor is provided. The transistor comprises a metal-oxide semiconductor layer, a source electrode, a drain electrode, a dielectric layer, a hydrogen-containing insulating layer, and a gate electrode. The metal-oxide semiconductor layer comprises a source region, a drain region, and a channel region. The source region, the drain region, and the channel region respectively have a first hydrogen concentration, a second hydrogen concentration, and a third hydrogen concentration, and each of the first hydrogen concentration and the second hydrogen concentration is greater than the third hydrogen concentration. The source electrode is disposed over the source region. The drain electrode is disposed over the drain region. The dielectric layer is disposed over the source electrode, the drain electrode, and the metal-oxide semiconductor layer. The hydrogen-containing insulating layer is disposed over the dielectric layer, and the hydrogen-containing insulating layer has an aperture exposing a surface of the dielectric layer. The hydrogen-containing insulating layer and the aperture are overlapped with the metal-oxide semiconductor layer when viewed in a direction perpendicular to the surface. The gate electrode is disposed in the aperture.

In some embodiments, a width of the aperture of the hydrogen-containing insulating layer defines a length of the channel region of the metal-oxide semiconductor layer.

In some embodiments, the source region and the drain region are overlapped with the hydrogen-containing insulating layer when viewed in the direction perpendicular to the surface.

In some embodiments, a width of the aperture is less than a length of the metal-oxide semiconductor layer.

In some embodiments, each of the first hydrogen concentration and the second hydrogen concentration are ranged from about $10^{16}$ atoms/cm² to about $10^{22}$ atoms/cm².

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
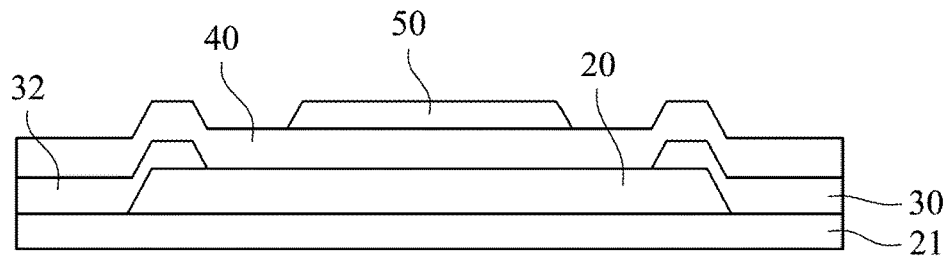
FIG. 1 to FIG. 4 are cross-sectional views schematically illustrating a conventional method of manufacturing a self-aligned transistor at various stages.
Figure 2:
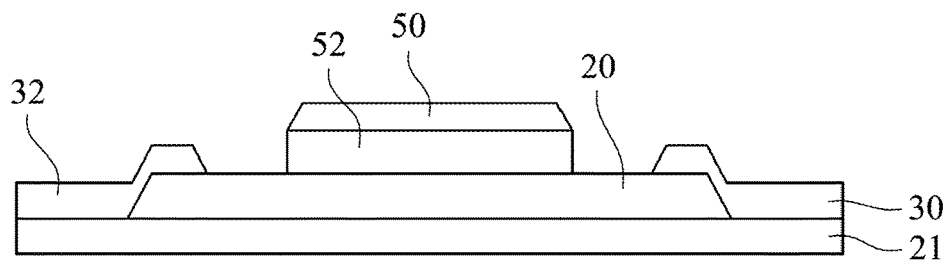
Figure 3:
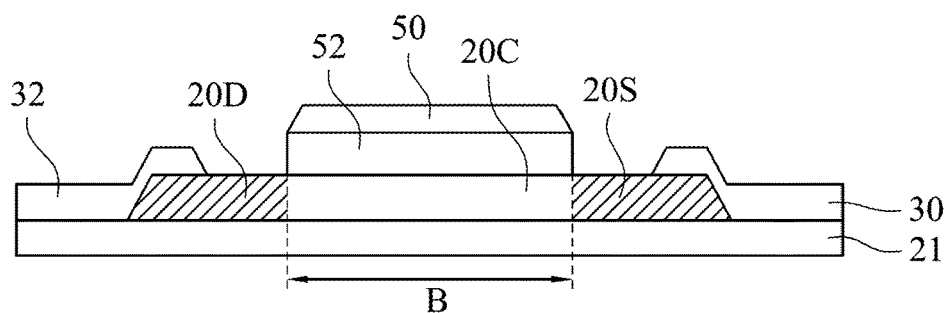
Figure 4:
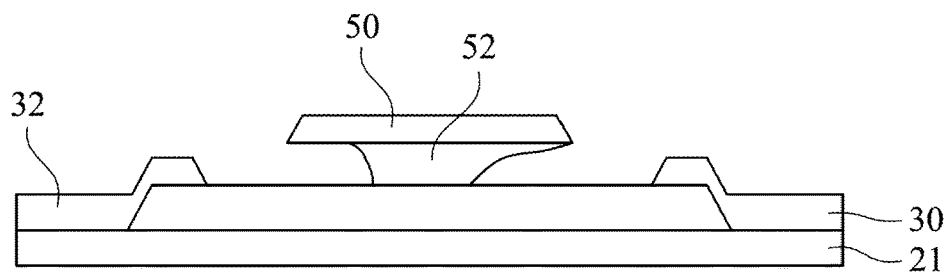

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and elements are schematically shown in order to simplify the drawings.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 5:
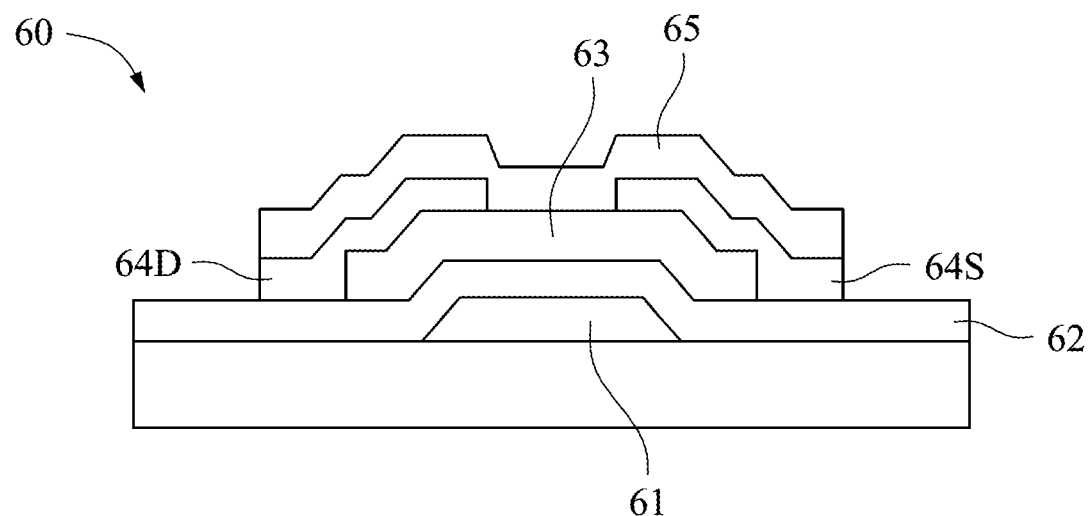
FIG. 5 to FIG. 10 are cross-sectional views schematically illustrating transistors and the current-voltage characteristic curves thereof according to some examples of the present disclosure.
Figure 6:
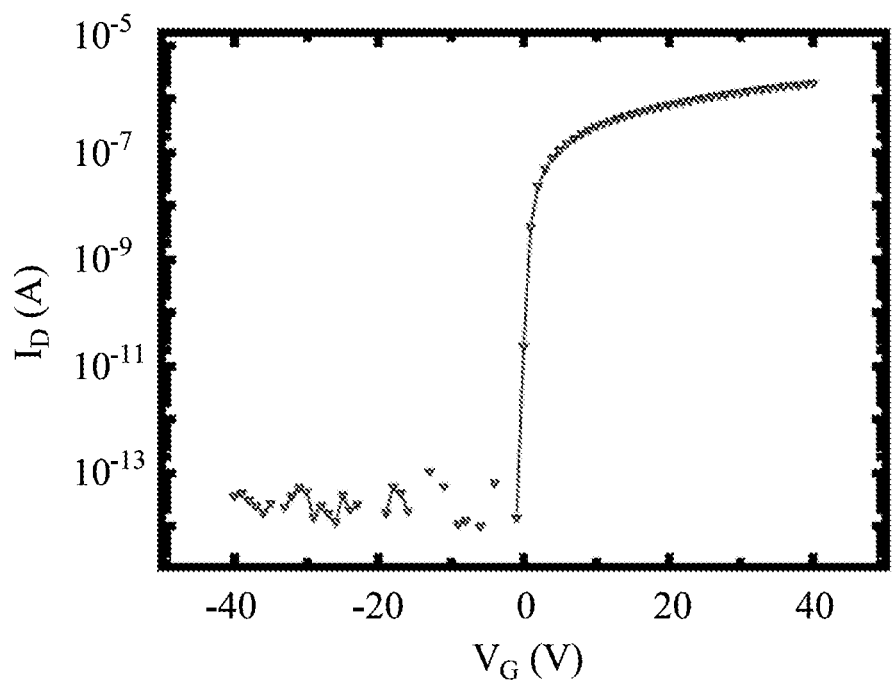

FIG. 5 to FIG. 10 are cross-sectional views schematically illustrating transistors and the current-voltage characteristic curves thereof according to some embodiments of the present disclosure. FIG. 5 schematically depicts a cross-sectional view of a transistor 60 according to one embodiment of the present disclosure. A method of manufacturing the transistor 60 is briefly described below. A gate electrode 61 is formed over a substrate, and thereafter a gate dielectric layer 62 is formed to cover the gate electrode 61. Subsequently, an indium gallium zinc oxide (IGZO) layer 63 is formed over the gate dielectric layer 62. Afterwards, a source electrode 643 and a drain electrode 64D are formed at opposite sides of the IGZO layer 63, and cover portions of the IGZO layer 63. Thereafter, a silicon oxide layer 65 is formed covering the IGZO layer 63, the source electrode 64S, and the drain electrode 64D so to form the transistor 60. Afterwards, the transistor 60 is placed into a furnace at a temperature of 350° C. to perform a heat treatment for approximately 60 minutes, in which an atmosphere in the furnace is air. After the heat treatment, the current ($I_D$)-voltage ($V_G$) characteristic curve of the transistor 60 is measured, and the measured result is shown in FIG. 6. As shown in FIG. 6, even though the transistor 60 has experienced the heat treatment at approximately 350° C., the transistor still possesses the switching function. The test result shows that the IGZO layer 63 covered by the silicon oxide layer 65 still has good semiconductor characteristics after experiencing a high temperature treatment.

Figure 7:
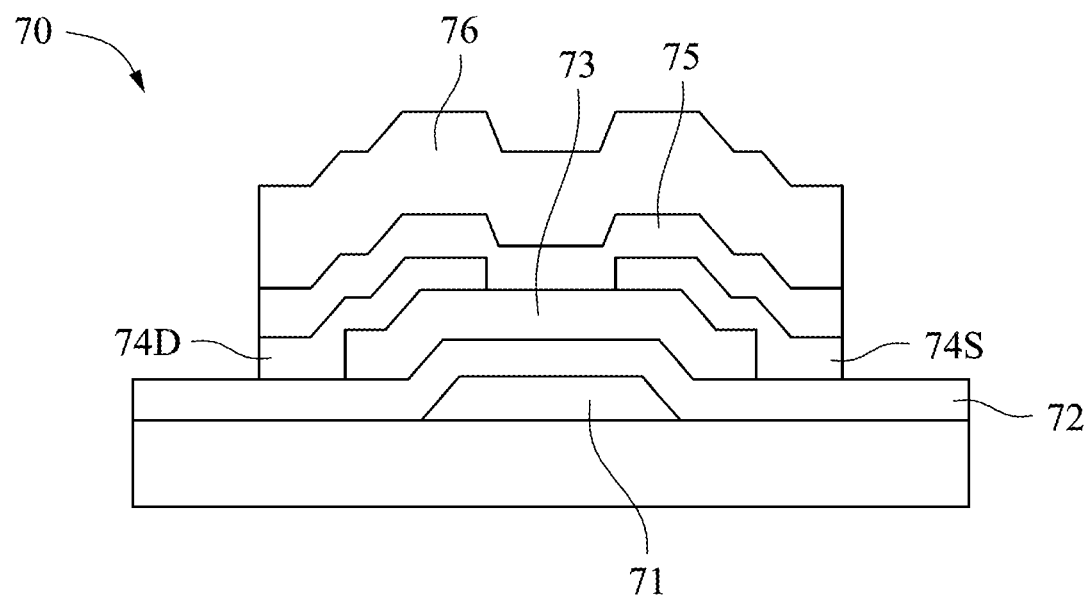
Figure 8:
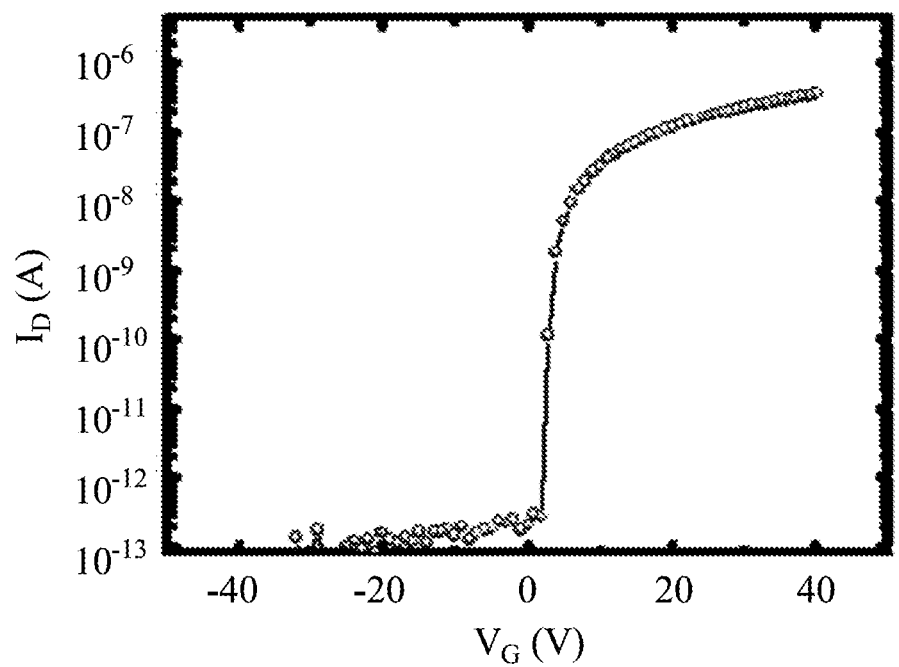

FIG. 7 is a cross-sectional view schematically illustrating a transistor 70 according to another embodiment of the present disclosure. The method of manufacturing the transistor 70 is briefly described below. A gate electrode 71 is forTied over a substrate, and thereafter a gate dielectric layer 72 is formed covering the gate electrode 71. Subsequently, an IGZO layer 73 is formed over the gate dielectric layer 72. Thereafter, a source electrode 74S and a drain electrode 74D are formed at opposite sides of the IGZO layer 73, and cover portions of the IGZO layer 73. Afterwards, a silicon oxide layer 75 is formed to cover the IGZO layer 73, the source electrode 74S, and the drain electrode 74D. Then, a hydrogen-containing silicon nitride layer 76 is formed over the silicon oxide layer 75 so as to form the transistor 70. In this embodiment, the hydrogen concentration of the hydrogen-containing silicon nitride layer 76 is ranged from about $2\times10^{15}$ atoms/cm² to about $25\times10^{15}$ atoms/cm², and the hydrogen concentration varies with depth. FIG. 8 depicts a current ($I_D$)-voltage ($V_G$) characteristic curve of the transistor 70. As shown in FIG. 8, even through the hydrogen-containing silicon nitride layer 76 is formed on the silicon oxide layer 75 of the transistor 70, the transistor 70 still possesses a switching function. This result suggests that the IGZO layer 73 still has good semiconductor characteristics even though the hydrogen-containing silicon nitride layer 76 is formed on the silicon oxide layer 75.

Figure 9:
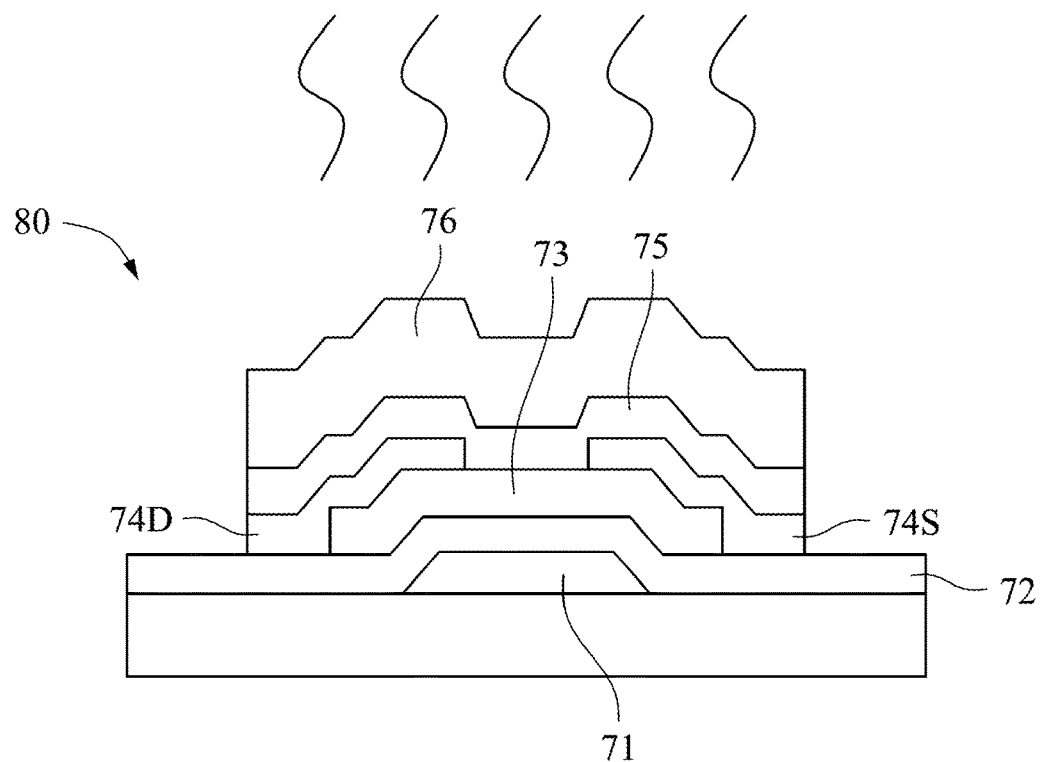
Figure 10:
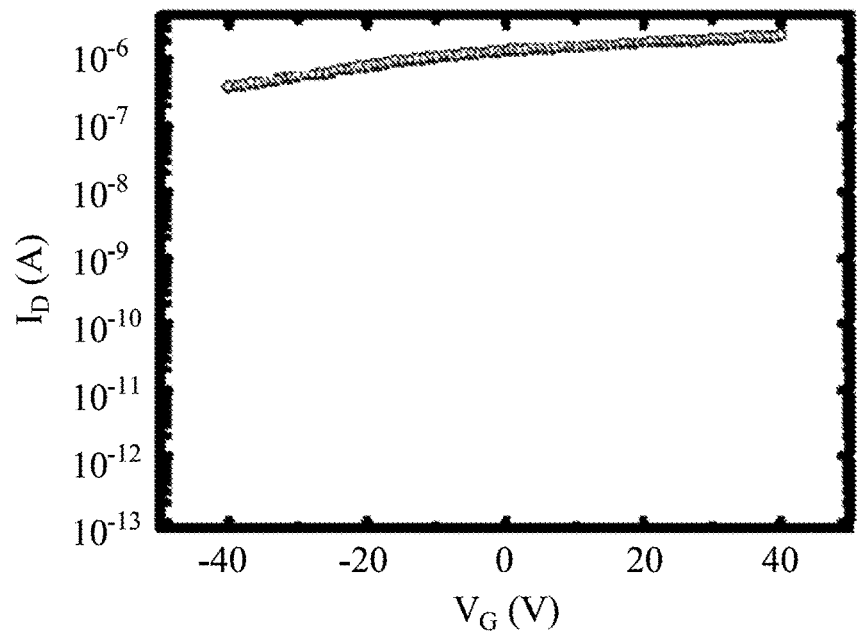

FIG. 9 is a cross-sectional view schematically illustrating a transistor 80 according to still another embodiment of the present disclosure. The transistor 80 is obtained by placing the transistor 70 illustrated in FIG. 7 into a furnace at a temperature of 350° C. for approximately 60 minutes, in which an atmosphere in the furnace is air. After the heat treatment, the current ($I_D$)-voltage ($V_G$) characteristic curve of the transistor 80 is measured, and the measured result is shown in FIG. 10. It is observed in FIG. 10 that the transistor 80 has lost the switching function associated with a transistor. The IGZO layer in the transistor 80 has transformed into a conductor, without characteristics of semiconductor anymore.

From the embodiment illustrated in FIG. 5 to FIG. 6, it is evident that performing a high-temperature treatment to the transistor 60 at 350° C. does not cause the IGZO layer 63 to lose semiconductor characteristics. From the embodiment illustrated in FIG. 7 to FIG. 8, it is evident that forming the hydrogen-containing silicon nitride layer 76 on the silicon oxide layer 75 of the transistor 70 does not cause the IGZO layer 73 to lose semiconductor characteristics, too. However, when the hydrogen-containing silicon nitride layer 76 is formed on the silicon oxide layer 75 of the transistor 70 and followed by a high-temperature treatment at 350° C., the IGZO layer 73 is changed from a layer with semiconductor properties to a layer with conductive properties. In other words, the metal-oxide semiconductor material may be transformed from a semiconductor to a conductor by way of indirect contact. According to some aspects, the present disclosure is derived from the above enlightenment.

Figure 11:
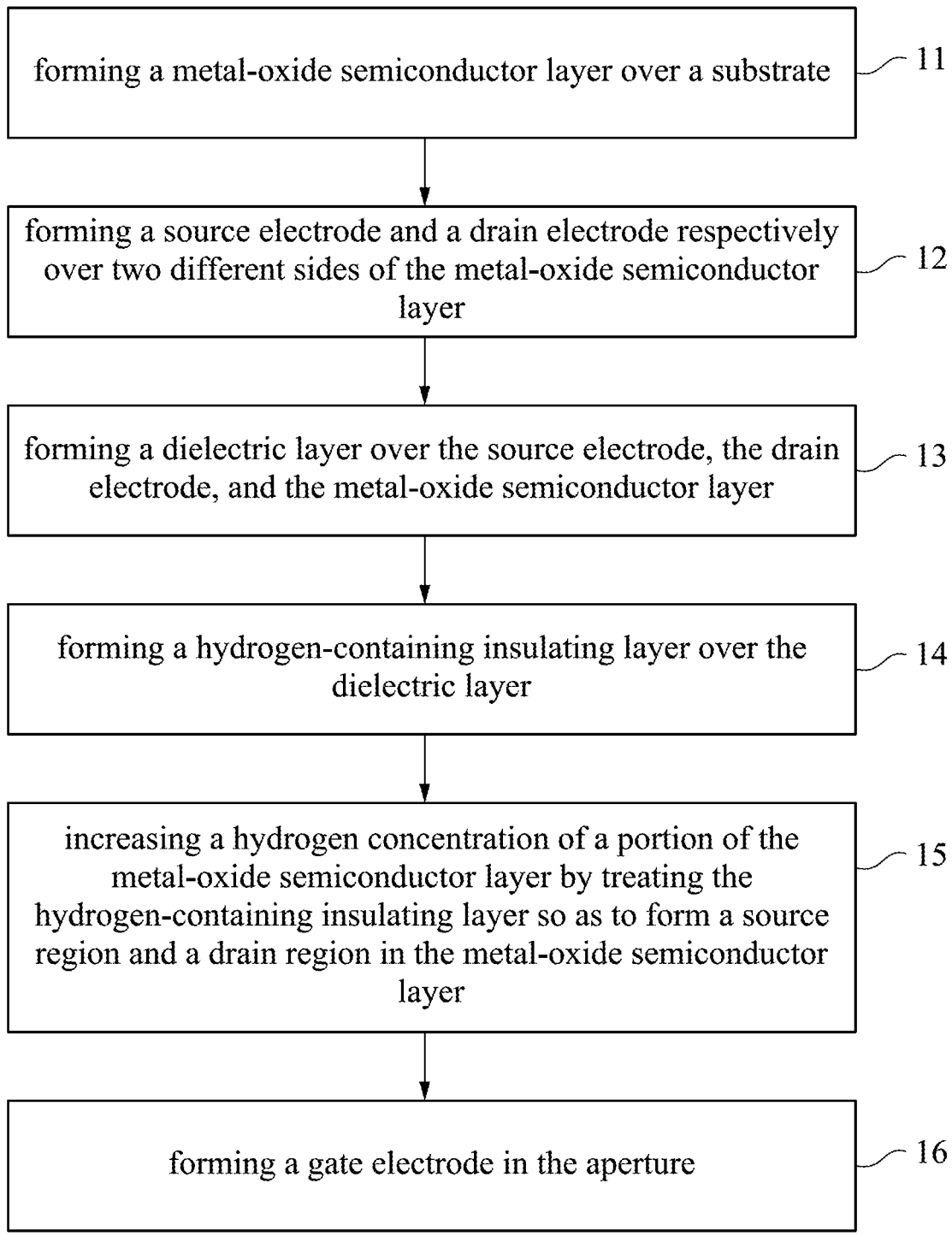
FIG. 11 is a flowchart illustrating a method of manufacturing a transistor according to various embodiments of the present disclosure.

FIG. 11 is a flowchart illustrating a method 1 of manufacturing a transistor according to various embodiments of the present disclosure. FIGS. 12-16 are cross-sectional views schematically illustrating the method 1 of manufacturing the transistor at various process stages according to some embodiments of the present disclosure. As shown in FIG. 11, the method 1 includes an operation 11, an operation 12, an operation 13, an operation 14, an operation 15, and an operation 16.

Figure 12:
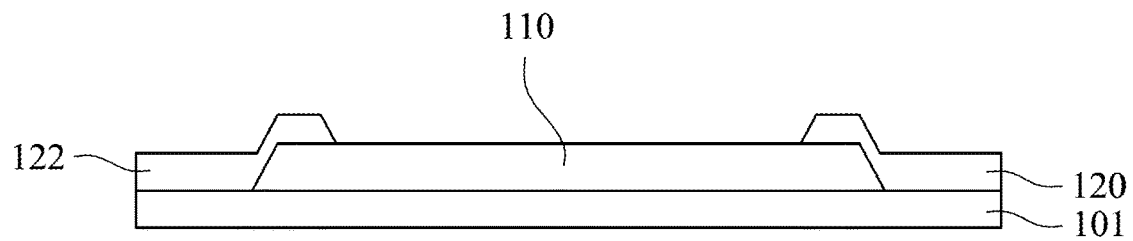
FIG. 12 to FIG. 16 are cross-sectional views schematically illustrating the method of manufacturing a transistor at various stages according to some embodiments of the present disclosure.

In operation 11, a metal-oxide semiconductor layer is formed over a substrate. With reference to FIG. 12, a metal-oxide semiconductor layer 110 is formed over a substrate 101. There is no specific limitation on the formation of the metal-oxide semiconductor layer 110. In examples, conventional deposition-lithography-etching technologies may be employed to form a patterned metal-oxide semiconductor layer 110. The metal-oxide semiconductor layer 110 may includes amorphous indium gallium zinc oxide (a-IGZO), indium zinc oxide (IZO), or amorphous indium zinc tin oxide (a-IZTO), for example. A thickness of the metal-oxide semiconductor layer 110 may be designed depending on practical needs, for example, in a range from about several tens of nanometers to about several micrometers.

In operation 12, a source electrode and a drain electrode are formed over two different sides of the metal-oxide semiconductor layer. As shown in FIG. 12, a source electrode 120 and a drain electrode 122 are formed over two different sides of the metal-oxide semiconductor layer 110. The source electrode 120 and the drain electrode 122 may be respectively formed on opposites sides of the metal-oxide semiconductor layer 110, and each of the source electrode 120 and the drain electrode 122 covers a portion of the metal-oxide semiconductor layer 110. The source electrode 120 and the drain electrode 122 may include a metal material such as for example platinum, gold, nickel, aluminum, molybdenum, copper, neodymium, chromium, alloys thereof, or combinations thereof.

Figure 13:
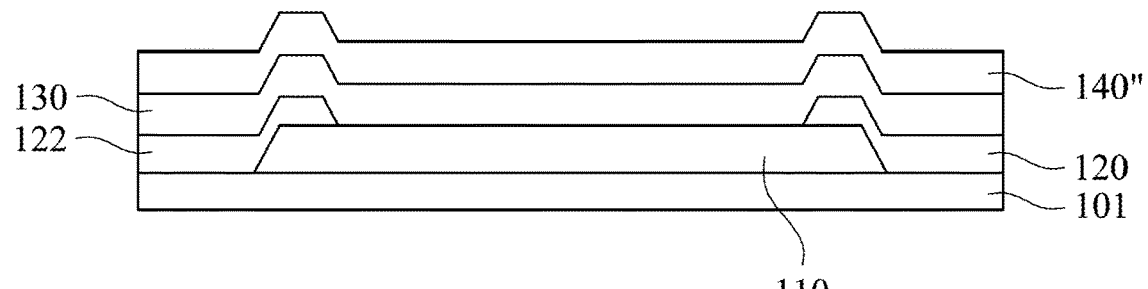

In operation 13, a dielectric layer is formed over the source electrode, the drain electrode, and the metal-oxide semiconductor layer. With reference to FIG. 13, a dielectric layer 130 is formed over the source electrode 120, the drain electrode 122, and the metal-oxide semiconductor layer 110. Illustrative examples of the material of the dielectric layer 130 includes silicon oxide, silicon oxynitride, or the like. The thickness of the dielectric layer 130 may also be designed depending on practical needs, for example, in a range from about several tens of nanometers to about several micrometers.

Figure 14:
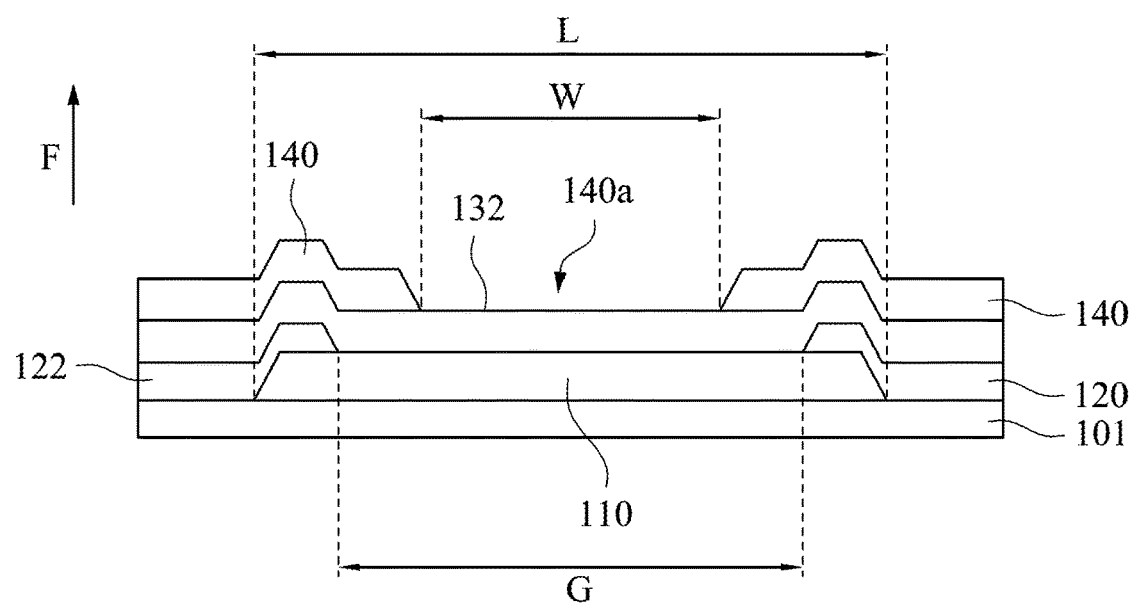

In operation 14, a hydrogen-containing insulating layer is formed over the dielectric layer. FIG. 13 and FIG. 14 are cross-sectional views schematically illustrating detail steps of performing the operation 14 at various process stages, according to some embodiments of the present disclosure. As illustrated in FIG. 13, a hydrogen-containing insulating layer 140" is deposited over the dielectric layer 130. The deposition approaches of the hydrogen-containing insulating layer 140" may be, for example, a chemical vapor deposition process, a plasma-enhanced chemical vapor deposition process, a sputtering process, or other suitable deposition technologies. Thereafter, referring to FIG. 14, the hydrogen-containing insulating layer 140" is patterned to form a patterned hydrogen-containing insulating layer 140 having an aperture 140*a* The approach of patterning the hydrogen-containing insulating layer 140" may be, for example, a dry plasma etching process, a reactive ion etching process, or a wet etching process using an etching solution. The aperture 140*a* of the hydrogen-containing insulating layer 140 exposes a surface 132 of the dielectric layer 130, and the aperture 140*a* of the hydrogen-containing insulating layer 140 is overlapped with the metal-oxide semiconductor layer 110 when viewed in a direction F perpendicular to the surface 132. In other words, the aperture 140*a* of the hydrogen-containing insulating layer 140 corresponds to a position of the metal-oxide semiconductor layer 110. In some embodiments, a width W of the aperture 140*a* is smaller than a length L of the metal-oxide semiconductor layer 110. In some embodiments, the width W of the aperture 140*a* is smaller than a distance G between the source electrode 120 and the drain electrode 122.

Figure 15:
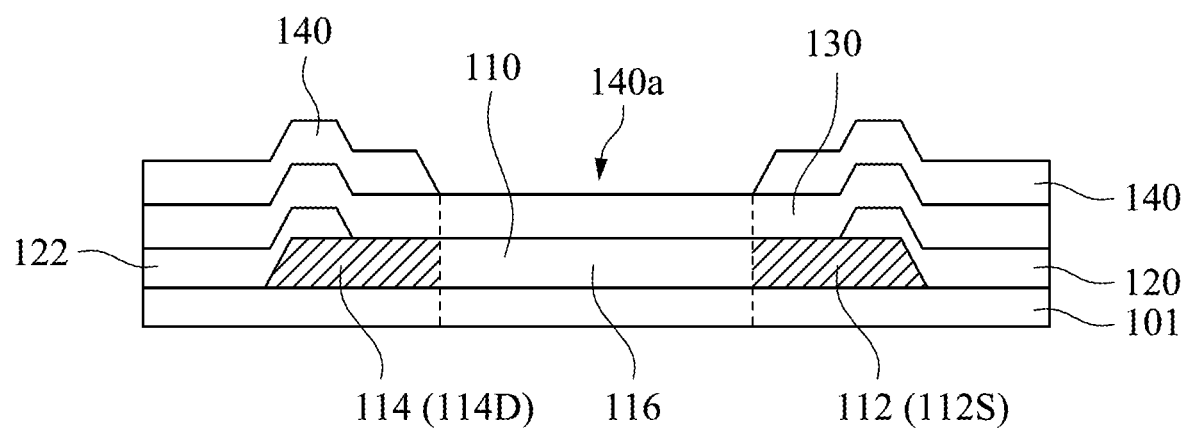

In operation 15, the hydrogen-containing insulating layer is treated to increase a hydrogen concentration of a portion of the metal-oxide semiconductor layer, thus forming a source region and a drain region in the metal-oxide semiconductor layer. With reference to FIG. 15, the hydrogen-containing insulating layer 140 is treated such that the hydrogen concentration of portions 112, 114 of the metal-oxide semiconductor layer 110 is increased so as to form a source region 112S and a drain region 114D in the metal-oxide semiconductor layer 110. In some embodiments, treating the hydrogen-containing insulating layer 140 includes subjecting the hydrogen-containing insulating layer 140 to a heat treatment at a temperature of about 300° C. to about 400° C. Under such a high temperature, the hydrogen atoms in the hydrogen-containing insulating layer 140 diffuse downwards through the dielectric layer 130 to the portions 112, 114 of the metal-oxide semiconductor layer 110 to form the source region 112S and the drain region 114D. In some other embodiments, the hydrogen-containing insulating layer 140 is irradiated with a laser beam such that the hydrogen atoms therein diffuse to the portions 112, 114 of the metal-oxide semiconductor layer 110, thus forming the source region 112S and the drain region 114D. Since the hydrogen concentration of the source region 112S and the drain region 114D in the metal-oxide semiconductor layer 110 is increased, the source region 112S and the drain region 114D are thus transformed from material with semiconductor properties into material with conductor properties. Hence, the source region 112S and the drain region 114D may be respectively regarded as the extensions of the source electrode 120 and the drain electrode 122. Therefore, a channel region 116 of the metal-oxide semiconductor layer 110 is defined between the source region 112S and the drain region 114D. In addition, since the source region 112S and the drain region 114D are formed in the metal-oxide semiconductor layer 110, the length of the channel region 116 may be decreased, and the decrease in channel length is helpful in enhancing the electrical performance of the transistor.

On the other hand, the positions and area sizes of the source region 112S and the drain region 114D are determined by that of the hydrogen-containing insulating layer 140. Hence, the source region 112S and the drain region 114D are formed by "self-alignment" from the hydrogen-containing insulating layer 140. As a result, the parasitic capacitances in the transistor can be reduced. For example, the parasitic capacitance between the gate electrode and the source electrode and the parasitic capacitance between the gate electrode and the drain electrode may be reduced.

More importantly, in the method disclosed hereinbefore, the dielectric layer does not have to be etched, and there is no any problem associated with the over-etching and/or narrow process margin in the etching process. Therefore, the manufacture yield of the transistor may be considerably increased.

In some embodiments, the source region 112S has a first hydrogen concentration, the drain region 114D has a second hydrogen concentration, and the first hydrogen concentration and the second hydrogen concentration are ranged from about $10^{16}$ atoms/cm$^2$ to about $10^{22}$ atoms/cm$^2$, for example, approximately $10^{16}$ atoms/cm$^2$, approximately $10^{17}$ atoms/cm$^2$, approximately $10^{18}$ atoms/cm$^2$, approximately $10^{19}$ atoms/cm$^2$, approximately $10^{20}$ atoms/cm$^2$, or approximately $10^{21}$ atoms/cm$^2$. The channel region 116 has a third hydrogen concentration, and the third hydrogen concentration is less than each of the first hydrogen concentration and the second hydrogen concentration. For example, the third hydrogen concentration may be ranged from about 0 to about $10^{16}$ atoms/cm$^2$. In some embodiments, the hydrogen-containing insulating layer 140 includes silicon nitride, silicon oxynitride, or the like. In one embodiment, the hydrogen-containing insulating layer 140 is made of silicon nitride, and the dielectric layer 130 is made of silicon oxide. In another embodiment, the hydrogen-containing insulating layer 140 is made of silicon oxynitride (SiO$_x$N$_y$), where x<y; the dielectric layer 130 is made of silicon oxynitride (SiO$_a$N$_b$), where a>b.

In some embodiments, the hydrogen concentration of the hydrogen-containing insulating layer 140 is greater than the hydrogen concentration of the dielectric layer 130. In some examples, the hydrogen-containing insulating layer 140 has the hydrogen concentration of at least approximately $10^{15}$ atom/cm$^2$, for example, about 2×$10^{15}$ atoms/cm$^2$, about $10^{16}$ atoms/cm$^2$, about $10^{17}$ atoms/cm$^2$, about $10^{18}$ atoms/cm$^2$, about $10^{19}$ atoms/cm$^2$, about $10^{20}$ atoms/cm$^2$, about $10^{21}$ atoms/cm$^2$, or about $10^{22}$ atoms/cm$^2$.

Figure 16:
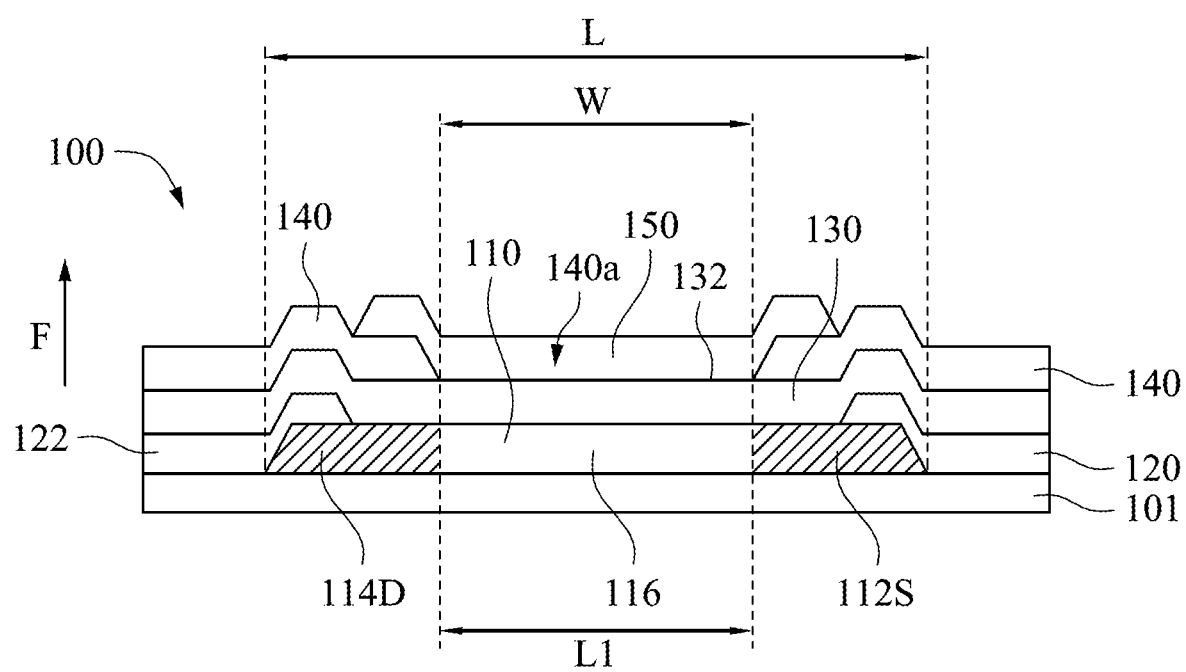

In operation 16, a gate electrode is formed in the aperture. With reference to FIG. 16, a gate electrode 150 is formed in the aperture 140a of the hydrogen-containing insulating layer 140, and thus a transistor 100 is fabricated. In some embodiments, the gate electrode 150 is in contact with the underneath dielectric layer 130, and laterally extends from the aperture 140a to a position over the hydrogen-containing insulating layer 140. There is no particular limitation on the method of forming the gate electrode 150. In examples, the gate electrode 150 may be formed using conventional deposition-photolithography-etching technologies. The gate electrode 150 may include metallic material such as for example platinum, gold, nickel, aluminum, molybdenum, copper, neodymium, chromium, alloys thereof, or a combination thereof.

According to another aspect of the present disclosure, a transistor is provided. FIG. 16 also schematically illustrates a cross-sectional view of a transistor 100, according to various embodiments of the present disclosure. The transistor 100 includes a metal-oxide semiconductor layer 110, a source electrode 120, a drain electrode 122, a dielectric layer 130, a hydrogen-containing insulating layer 140, and a gate electrode 150.

The metal-oxide semiconductor layer 110 includes a source region 112S, a drain region 114D, and a channel region 116. The source region 112S has a first hydrogen concentration; the drain region 114D has a second hydrogen concentration; the channel region 116 has a third hydrogen concentration; and each of the first hydrogen concentration and the second hydrogen concentration is greater than the third concentration. In other words, each of the hydrogen concentrations of the source region 112S and the drain region 114D is greater than the hydrogen concentration of the channel region 116. In some embodiments, the first hydrogen concentration and the second hydrogen concentration are ranged from about $10^{16}$ atoms/cm$^2$ to about $10^{22}$ atoms/cm$^2$.

The source electrode 120 and the drain electrode 122 are respectively positioned over the source region 112S and the drain region 114D. For example, the source electrode 120 and the drain electrode 122 respectively cover and in contact with the source region 112S and the drain region 114D.

The dielectric layer 130 is positioned over the source electrode 120, the drain electrode 122, and the metal-oxide semiconductor layer 110. The material of dielectric layer 130 may be, for example, silicon oxide, silicon oxynitride, or the like.

The hydrogen-containing insulating layer 140 is positioned over the dielectric layer 130, and the hydrogen-containing insulating layer 140 has an aperture 140a exposing a surface 132 of the dielectric layer 130. When viewed in a direction F perpendicular to the surface 132, portions of the metal-oxide semiconductor layer 110 are overlapped with the hydrogen-containing insulating layer 140. In addition, the metal-oxide semiconductor layer 110 is overlapped with the aperture 140a In some embodiments, the source region 112S and the drain region 114D of the metal-oxide semiconductor layer 110 are approximately under the hydrogen-containing insulating layer 140. In other words, the source region 112S and the drain region 114D are substantially the portions of the metal-oxide semiconductor layer 110 that are overlapped with the hydrogen-containing insulating layer 140. In some embodiments, the width W of the aperture 140a of the hydrogen-containing insulating layer 140 defines the length L1 of the channel region 116 of the metal-oxide semiconductor layer 110, and the width W of the aperture 140a is smaller than the length L of the metal-oxide semiconductor layer 110.

The gate electrode 150 is disposed in the aperture 140a of the hydrogen-containing insulating layer 140. In some embodiments, the gate electrode 150 is in contact with the dielectric layer 130 underneath, and laterally extends from the aperture 140a to a position over the hydrogen-containing insulating layer 140.

It will be apparent to those skilled in the art that various modifications and variations can be made to the structure of the present invention without departing from the scope or spirit of the invention. In view of the foregoing, it is intended that the present invention cover modifications and variations of the present disclosure provided they fall within the scope of the following claims and their equivalents.

What is claimed is:

1. A transistor, comprising:
   a metal-oxide semiconductor layer comprising a source region, a drain region, and a channel region, wherein the source region, the drain region, and the channel region respectively have a first hydrogen concentration, a second hydrogen concentration, and a third hydrogen concentration, and each of the first hydrogen concentration and the second hydrogen concentration is greater than the third hydrogen concentration;
   a source electrode positioned over the source region;
   a drain electrode positioned over the drain region;
   a dielectric layer positioned over the source electrode, the drain electrode, and the metal-oxide semiconductor layer;
   a hydrogen-containing insulating layer disposed over the dielectric layer, and having an aperture exposing a surface of the dielectric layer, wherein the hydrogen-containing insulating layer and the aperture are overlapped with the metal-oxide semiconductor layer when viewed in a direction perpendicular to the surface; and
   a gate electrode disposed in the aperture.

2. The transistor of claim 1, wherein the aperture of the hydrogen-containing insulating layer has a width that defines a length of the channel region of the metal-oxide semiconductor layer.

3. The transistor of claim 1, wherein the source region and the drain region are overlapped with the hydrogen-containing insulating layer when viewed in the direction perpendicular to the surface.

4. The transistor of claim 1, wherein the aperture has a width that is less than a length of the metal-oxide semiconductor layer.

5. The transistor of claim 1, wherein each of the first hydrogen concentration and the second hydrogen concentration is ranged from about $10^{16}$ atoms/cm$^2$ to about $10^{22}$ atoms/cm$^2$.

* * * * *